United States Patent [19]

Shealy et al.

[11] 4,262,296
[45] Apr. 14, 1981

[54] VERTICAL FIELD EFFECT TRANSISTOR WITH IMPROVED GATE AND CHANNEL STRUCTURE

[75] Inventors: James R. Shealy; Bantval J. Baliga, both of Clifton Park; Wirojana Tantraporn, Schenectady; Peter V. Gray, Scotia, all of N.Y.

[73] Assignee: General Electric Company, Schenectady, N.Y.

[21] Appl. No.: 61,450

[22] Filed: Jul. 27, 1979

[51] Int. Cl.³ .............................................. H01L 29/06
[52] U.S. Cl. ......................................... 357/55; 357/22
[58] Field of Search ................................... 357/22, 55

[56] References Cited

U.S. PATENT DOCUMENTS

| | | | |
|---|---|---|---|
| 3,761,785 | 9/1973 | Pruniaux | 357/23 |
| 3,851,379 | 12/1974 | Gutknecht et al. | 357/23 |
| 4,070,690 | 1/1978 | Wickstrom | 357/23 |
| 4,129,879 | 12/1978 | Tantraporn | 357/23 |
| 4,171,234 | 10/1979 | Nagata et al. | 357/55 |

OTHER PUBLICATIONS

J. Electrochem. Soc.-vol. 118, No. 1, Jan. 1971, pp. 118-122, Tarui et al.
J. Electrochem. Soc.-vol. 118, No. 5, May 1971, pp. 768-771, Iida et al.
G.E. R&D Dist.-Rpt. No. 74CRD039-Feb. 1974, Tantraporn et al.
J. Electrochem Soc.-vol. 122, No. 12, Dec. 1975, pp. 1666-1671, Smeltzer.

*Primary Examiner*—Edward J. Wojciechowicz
*Attorney, Agent, or Firm*—Donald R. Campbell; Marvin Snyder; James C. Davis

[57] ABSTRACT

A high frequency field effect transistor of gallium arsenide or other III-V semiconductor compounds has a preferentially etched trapezoidal groove structure in the top surface which creates parallel trapezoidal semiconductor fingers that are wider at the top than at the bottom. Schottky gates or junction gates are fabricated within the grooves surrounding the elongated fingers. The vertical conducting channels between the gates are narrow leading to a high blocking gain, and more contact area is available at the top of the device.

14 Claims, 14 Drawing Figures

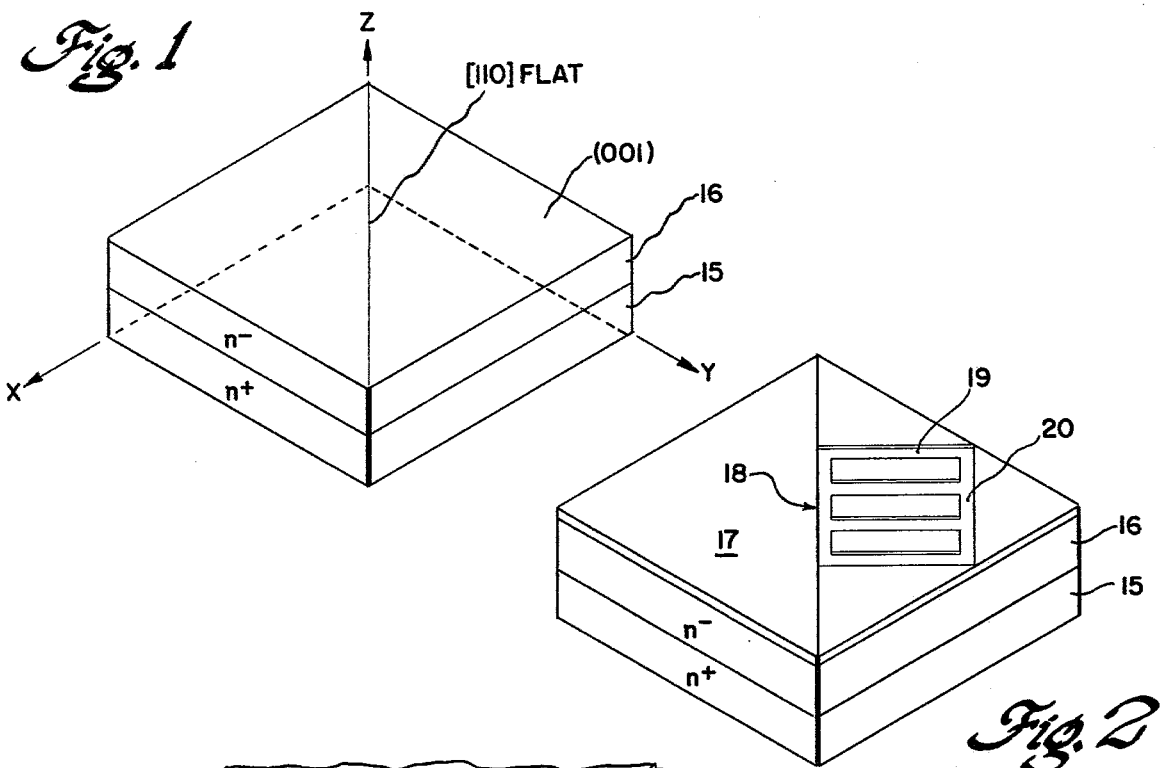
Fig. 1
Fig. 2
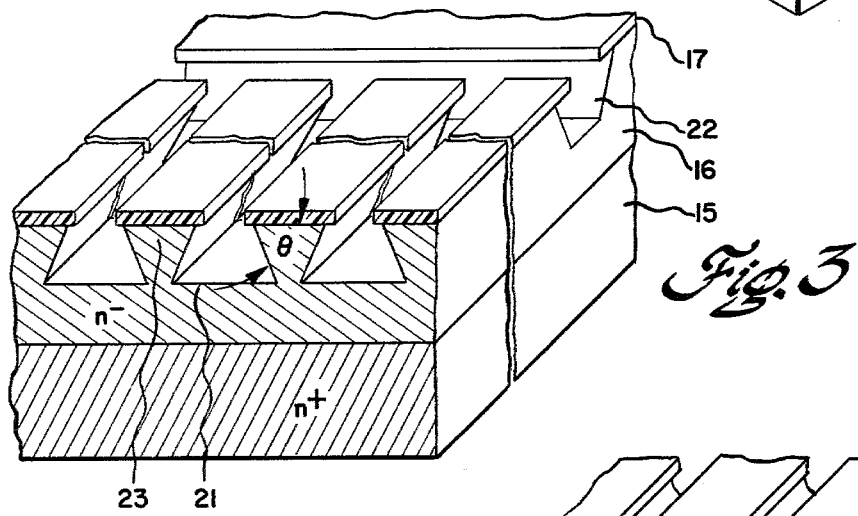
Fig. 3
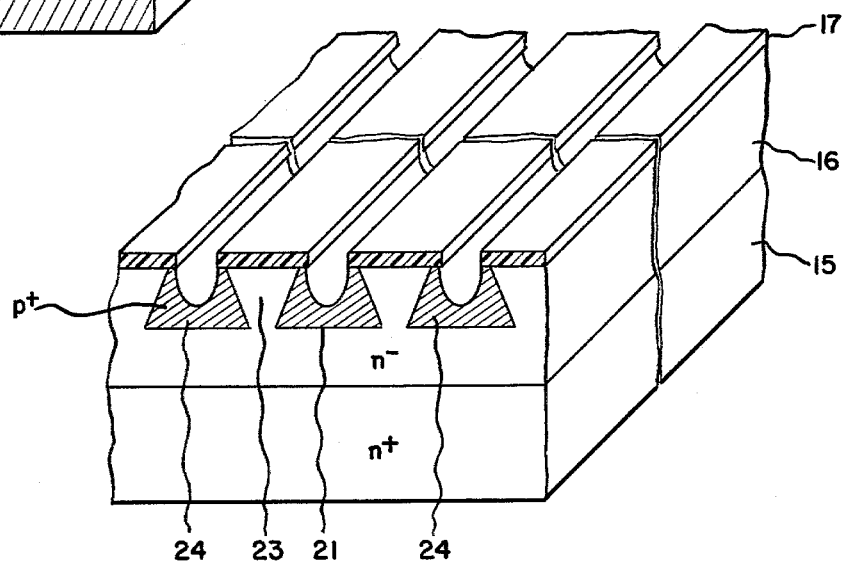
Fig. 4

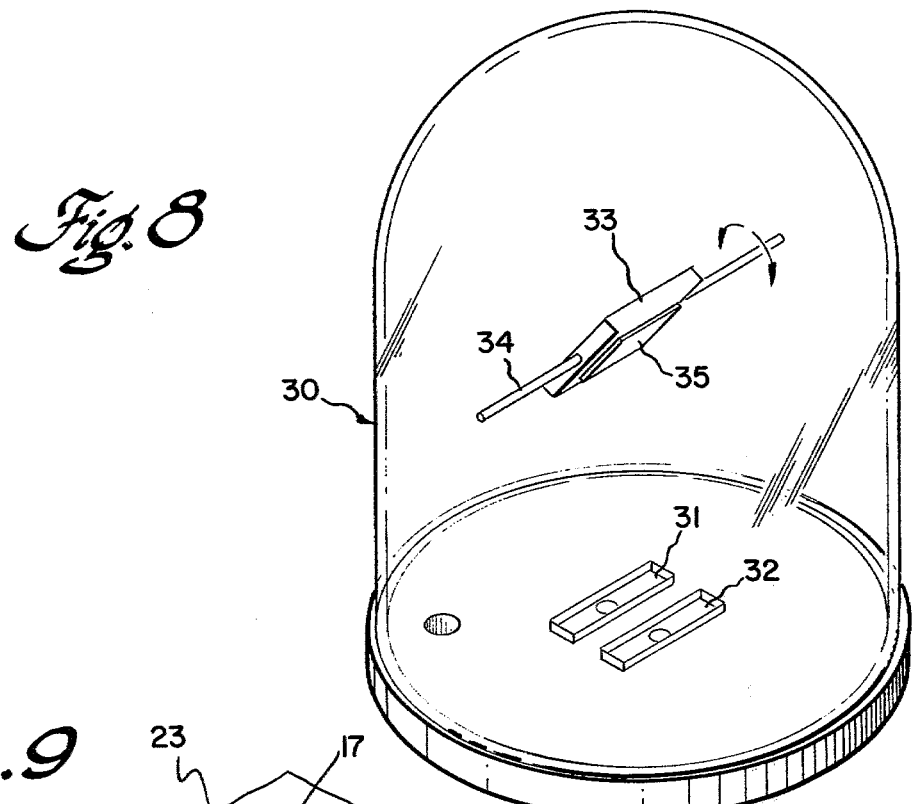
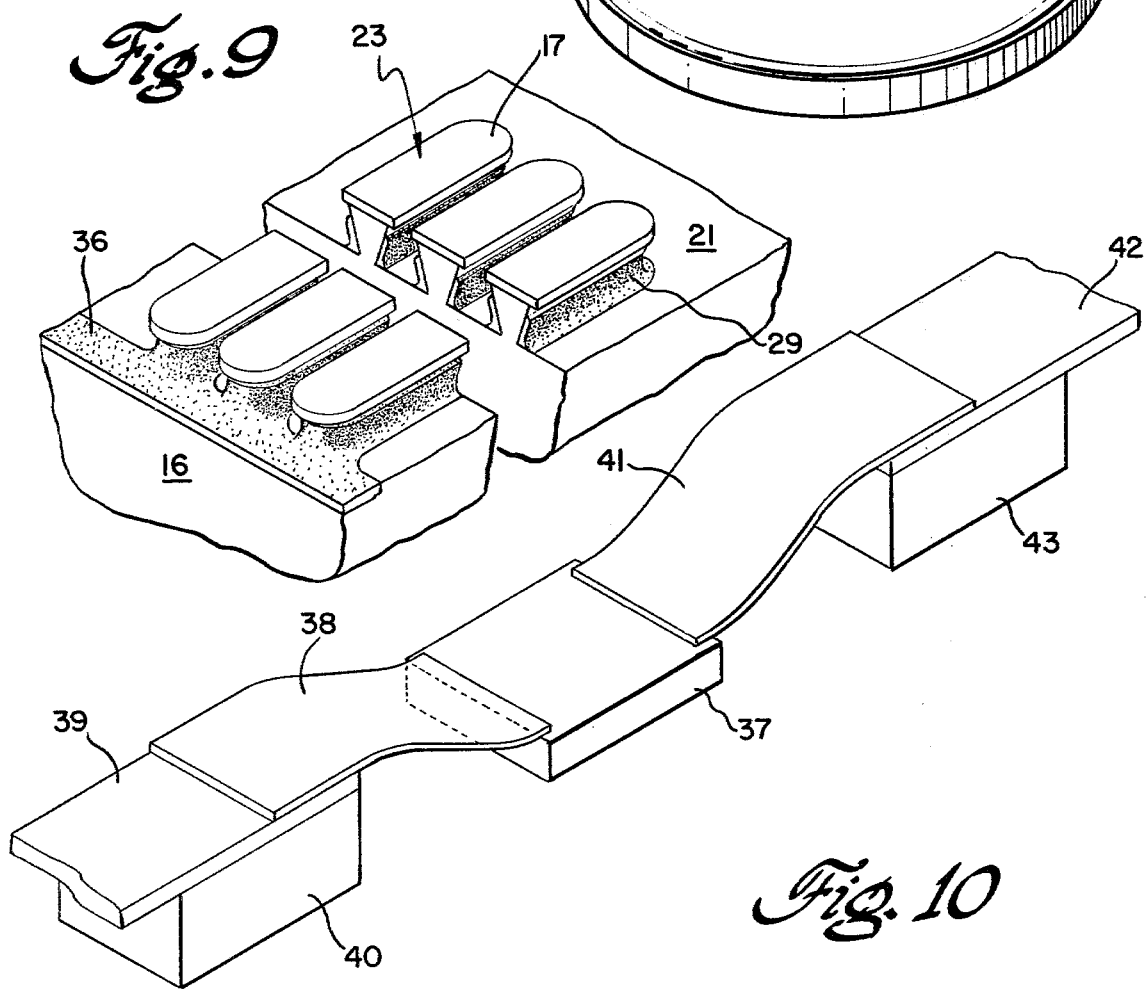

VERTICAL FIELD EFFECT TRANSISTOR WITH IMPROVED GATE AND CHANNEL STRUCTURE

BACKGROUND OF THE INVENTION

This invention relates to high frequency semiconductor devices and methods for their fabrication, and more particularly to gallium arsenide and other III–V semiconductor field effect transistors which have a vertical geometry.

The vertical field effect transistor described in U.S. Pat. No. 4,129,879, granted on Dec. 12, 1978 to W. Tantraporn and S.P. Yu, is a bulk conduction device employing three semiconductor regions of like conductivity type, preferably n-type gallium arsenide. Current flow is essentially normal to the surface as compared with horizontal devices in which current flow is parallel to the surface, and the vertical FET attains higher power at a higher frequency of operation than the conventional horizontal FET. The channel regions in an interdigitated device are in elongated fingers or mesa structures upstanding from the substrate which is the common source or drain, and gate metal surrounds the finger and forms an electronically blocking contact to the channel region, which extends completely across the finger from wall to wall without interruption. If constructed via the usual techniques, described in the above-mentioned patent, an epitaxial n-GaAs layer is deposited on an n+ substrate and undergoes masking, etching grooves between the fingers, and deposition of insulator and metal. It is difficult to realize a uniform semiconductor finger width or conducting channel width in the order of one to several microns as is required for a microwave frequency device, and this approach produces a channel region geometry that is wide at the substrate and narrower near the surface, restricting the space available for the drain or source contact at the top.

SUMMARY OF THE INVENTION

The improved vertical field effect transistor has a trapezoidal groove structure realized by preferential etching and is peculiar to gallium arsenide and other III–V semiconductor compounds. The surface of a lightly doped semiconductor layer (such as n⁻ gallium arsenide) of the same conductivity type as a heavily doped substrate has a row of such parallel trapezoidal grooves which are connected together at either end by transversely extending grooves; the grooved pattern delineates a plurality of upstanding elongated semiconductor fingers which individually have an isosceles trapezoid cross section with a wide base at the surface and a narrow base interior of the device. The channel region is at and above each narrow base and extends from wall to wall, or substantially from wall to wall, of the trapezoidal finger. Gate regions are within the grooves surrounding every trapezoidal finger. Contact metallizations are deposited on the top surfaces of the trapezoidal fingers and on the opposing surface of the substrate, one being the drain contact and the other the source contact or vice versa. The advantage of this gate and channel structure is that there is a narrower channel to deplete and hence a lower gate voltage is required to pinch off the device, and that more area is available at the top of the device for the source or drain contact.

To fabricate the vertical FET in n-type III–V semiconductor compounds, a (001) plane oriented n+ substrate with a n⁻ epitaxial layer is used with a [110] flat edge indicated on the crystal (crystallographic directions are as defined in FIG. 1). An insulating layer is deposited on the surface and a pattern of openings is made including a row of windows normal to the [110] flat. Due to different etch rates in the vertical and lateral directions, a differential etch through these windows yields trapezoidal grooves, and there is an insulating layer overhang at the top of the grooves. The gate region is a Schottky metal gate deposited essentially only on the walls of the trapezoidal finger by evaporation of metal in the groove at an angle using the overhang to shadow the evaporation. Preventing metal deposits on the bottom of the groove reduces the junction capacitance of the gate and this is desirable in a high frequency device. Alternatively, the gate regions are p-n junction gates made by refill of the bottoms of the grooves with p+ epitaxial material, or by diffusion from either the vapor phase or using a doped oxide source. Contact to the latter is realized by vertical evaporation of metal on the diffused region on the bottom of the groove using the insulating layer overhang to shadow the evaporation.

A preferred embodiment is a high voltage, Schottky gate vertical field effect transistor useful as a power source for high power rf applications such as a microwave oven. This gallium arsenide device has an extended drain, with the source contact on top and the drain contact on the bottom surface. Another embodiment for ultra high frequency applications (above 1 GHz) has a narrow channel width of about 1 micron and the drain contact on the top.

BRIEF DESCRIPTION OF THE DRAWINGS

FIGS. 1–6 are schematic perspective and cross-sectional views of steps in the fabrication of a vertical field effect transistor with a trapezoidal groove structure and epitaxial refill junction gate;

FIG. 8 is a sketch of apparatus for evaporation of metal at an angle;

FIG. 9 is a schematic perspective of the Schottky gate vertical field effect transistor;

FIG. 10 shows the device soldered onto a ground plane with connecting leads;

DESCRIPTION OF THE PREFERRED EMBODIMENTS

Figure 5:
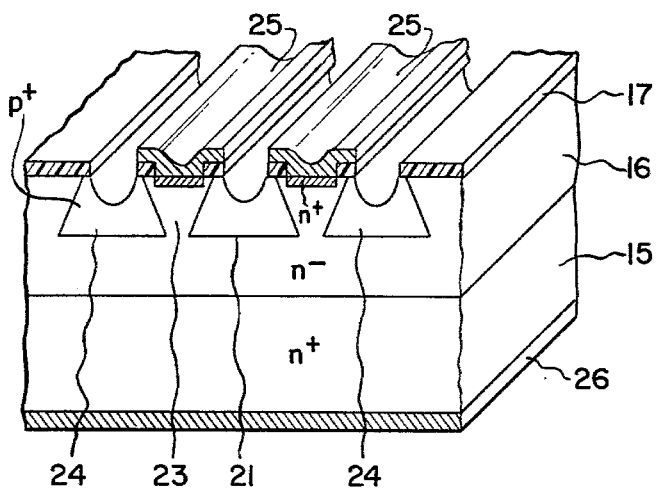

A trapezoidal groove grid structure is formed in gallium arsenide for use in the fabrication of a vertical field effect transistor. In addition, this structure can also be fabricated in other III–V compound semiconductors such as InP, in ternary III–V compounds such as GaAlAs, and in quaternary III–V compounds such as GaInAsP. The main processing steps involved in making an n-channel, depletion mode, gallium arsenide junction gate field effect transistor are depicted in FIGS. 1–6 and are: depositing an insulating layer on the gallium arsenide, opening rectangular windows in the insulating layer, preferentially etching the gallium arsenide through the rectangular windows, and refill of the etched grids.

Assuming that the crystallographic directions are defined as in FIG. 1, a thin substrate layer 15 of (001) plane n+ gallium arsenide material cut from a single crystal has an n− epitaxial layer 16 with a [110] flat (a natural cleavage plane) indicated on the crystal. A typical carrier concentration for the heavily doped substrate is approximately $10^{18}$ cm$^{-3}$ and for the lightly doped epitaxial layer is in the range of $10^{14}$–$10^{17}$ cm$^{-3}$ as required by the application. A silicon dioxide or other insulating layer 17, FIG. 2, has a pattern of openings 18 made by conventional photoresist and etching techniques. A row of rectangular windows 19 are oriented normal to the [110] crystal flat and these are connected together at either end by transversely extending rectangular openings 20. A preferential etch through rectangular windows 19 yields trapezoidal grooves 21, FIG. 3, due to anisotropic etch rates depending on the crystalline plane, i.e., the etched volume is bound by the slowest etched planes: (111) B on the side, and (001) on the bottom. The grooves more specifically have an isosceles trapezoid cross section with the narrow base of the trapezoid at the top and the wide base at the bottom. At the same time the etch through transverse openings 20 results in a pair of transversely extending grooves 22 which are also trapezoids but with the narrow base at the bottom and which are as deep as grooves 21 and undercut beneath insulating layer 17. After the etching process there remains a plurality of upstanding, parallel, elongated semiconductor fingers or mesa structures 23 which individually have an isosceles trapezoid cross section with a wide base at the surface and a narrow base interior of the device. The grooved grid structure 21, 22 completely encircles every trapezoidal semiconductor finger 23. The channel region extends from wall to wall of the trapezoidal finger and is at and above the narrow base; hence, a narrow channel is achieved after fabrication of the gate regions within the grooves.

One preferential etch solution to realize flat bottom trapezoidal grooves in gallium arsenide and other III–V semiconductor compounds is 1:H$_2$SO$_4$, 8:H$_2$O$_2$, 1:H$_2$O. The masked wafer was etched horizontally in a stirred or rotating solution at 0° C. (the ice point) for 4 to 5 minutes. The angle $\theta$ between the top surface and a nonparallel wall of the trapezoid was measured many times and is 61° to 63°. The vertical etch rate is about 2.5 microns/min and the side etch rate at the semiconductor oxide interface is about 0.8 microns/min.

To obtain a JFET (junction field effect transistor), the grooves are refilled with opposite conductivity type epitaxial material. The p+ epitaxial material 24 substantially fills trapezoidal grooves 21 or alternatively partially fills the grooves to a designated depth, and also is deposited in transverse grooves 22 at least to the extent of filling in the bottom of the grooves. The epitaxial refill can be performed in a H$_2$-AsCl$_3$-Ga vapor phase reactor. In one process, the growth temperature is 750° C. and the deposition rate is approximately 0.2 $\mu$m/min, and a satisfactory refill was accomplished after 25 minutes of growth. This vapor epitaxy process is further described in "Controlled, Abrupt Variations of Sn Doping in Vapor-Epitaxial GaAs", by W. Tantraporn and A. N. Coutant, Report No. 74CRD039, February 1974, available from General Electric Company, Corporate Research and Development Distribution, P.O. Box 43, Schenectady, New York 12301.

FIG. 5 shows the addition of a source contact 25 at the top of the device and a drain metallization 26 at the bottom. Because the wide base of trapezoidal semiconductor finger 23 is at the top, more area is available to fabricate an individual source contact for every finger. An elongated window is opened in insulating layer 17 by masking with photoresist and etching, and an n+ source region is diffused into the top of finger 23 followed by deposition of a metal such as gold or aluminum. The source metallization may cover the entire insulating layer strip at the top of the finger as shown in the figure. The width of the vertical conducting channel at the narrow base of trapezoidal finger 23 is on the order of 1–5 microns in a high frequency device, and the advantage of having more area at the top between the grid is evident.

Figure 6:
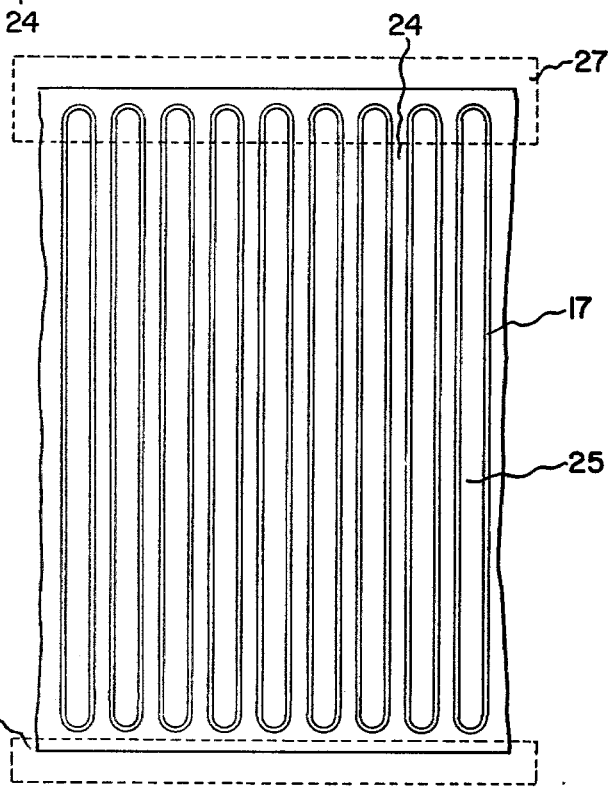

FIG. 6 is a fragmentary plan view of a completed interdigitated vertical field effect transistor. A thin gold ribbon 27 is bonded to the tops of source contacts 25 and interconnects them, and another such ribbon 28 is bonded to epitaxial refill gate region 24. The chief advantage of the trapezoidal groove and semiconductor finger structure is that there is a narrower channel to deplete (see FIG. 5) and hence a lower gate bias is required to pinch the device off. With sufficient negative gate potential, the depletion layer will extend toward the center of the trapezoidal finger, narrowing the conductive channel connecting the source and drain regions, and at pinch-off the entire width of every trapezoidal semiconductor finger is nonconducting.

Figure 7:
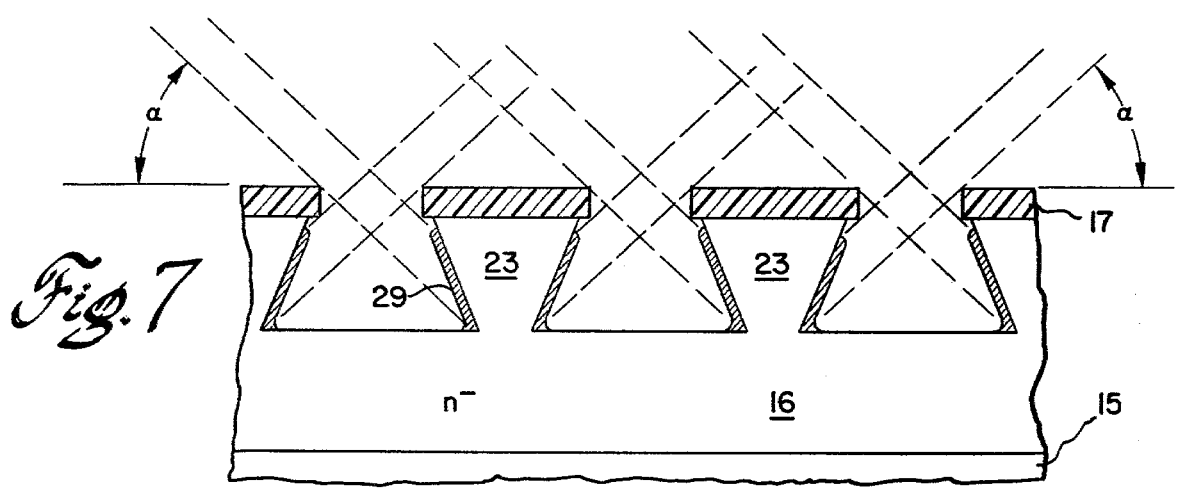
FIG. 7 is a cross section illustrating directional deposition of metal on the walls of the grooves to realize a Schottky gate.

The preferred embodiment is a gallium arsenide Schottky gate vertical field effect transistor realized by evaporating metal in the groove at an angle, FIG. 7, using the overhang of insulating layer 17 to shadow the evaporation so that gate metal 29 is deposited more on the walls of groove 21 than on the bottom. The metal extends the length of the groove wall for good blocking characteristics. In addition, for a high frequency device, it is desirable to reduce the junction capacitance of the grid or gate, and preventing metal deposits on the bottom of the groove reduces this capacitance. Further, because of the shadowing effect gate metal is prevented from being evaporated onto the top part of the wall of trapezoidal finger 23, this improves the voltage withstanding capability of the gate and the top electrode. In addition, with an appropriate oxide in the grooves a MOS gate may be fabricated using this technique A directional evaporation may be accomplished in a vacuum system 30 shown in FIG. 8. Note that two boats 31 and 32 are used in the apparatus. The GaAs (001) surface with the grooved grid region formed is mounted face down on a pad 33 which rotates about axis 34. The pad is rotated to form angle $\alpha$ between the direction of the evaporation and the GaAs wafer indicated generally at 35. Boat 31 is then heated and gold evaporates on one of the walls in the groove. The pad is then rotated to form an angle between the direction of evaporation on the opposite groove wall. Boat 32 is heated and the evaporation is complete on both grooved walls. The angle $\alpha$ was 30° in one reduction to practice.

As best seen in FIG. 9, gate metallization 29 is coated onto both ends of the long and narrow upstanding semiconductor finger 23 and completely surrounds this structure. An additional area of metallization 36 at one end of the row of "islands" interconnects the individual gate metallizations. A version of a completed high power device with leads is depicted in FIG. 10 soldered onto a metal ground plane 37 which is the drain electrode. A thin gold ribbon strip 38 is bonded, the same as in FIG. 6, to the source contacts on the top surfaces of the trapezoidal semiconductor fingers, and is bonded at the other end to a source electrode lead 39 attached to a ceramic block 40. A second gold ribbon strip 41 is bonded to gate interconnection metallization 36 (FIG. 9) and to a gate electrode lead 42 which is attached to ceramic block 43.

Figure 11:
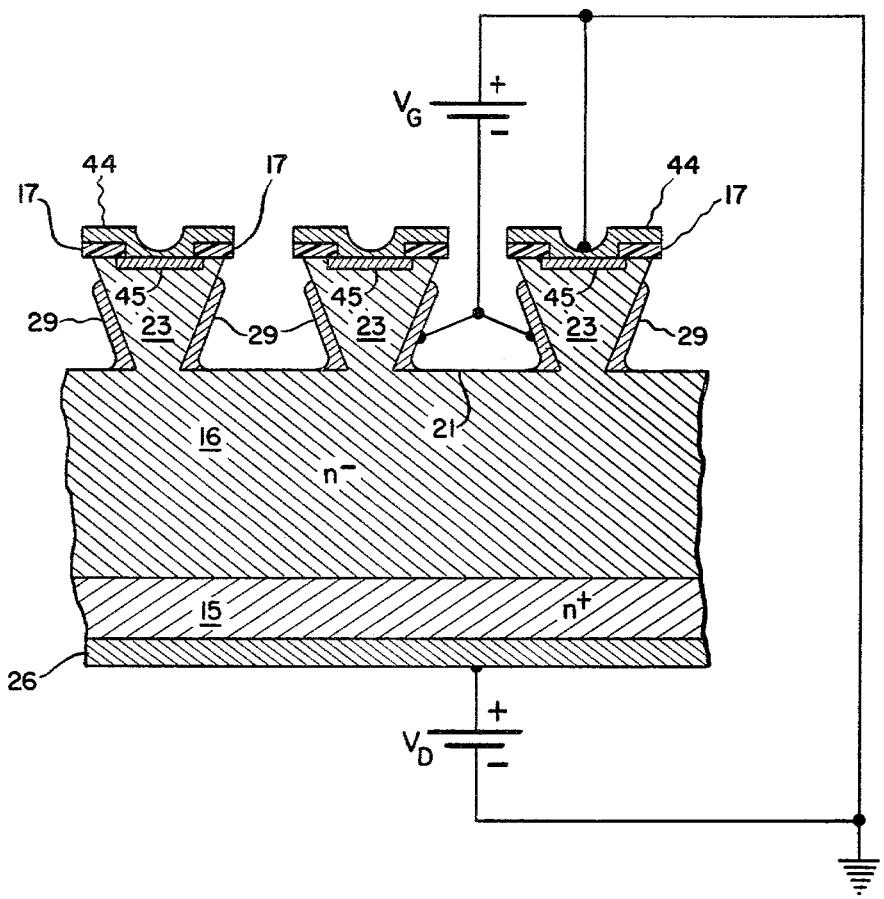
FIG. 11 is a cross-sectional diagram of a preferred embodiment of the invention, a gallium arsenide Schottky gate vertical FET for high voltage, high frequency applications.

The cross-sectional diagram in FIG. 11 shows further details of the preferred embodiment of the invention, a high voltage extended drain, Schottky gate vertical field effect transistor. This is a high power high frequency device suitable for operation at 1 GHz or lower. Source contacts 44 are at the top of the device and this diagram shows n+ source regions 45 which are desirable to improve ohmic contacts. Directionally deposited gate metal 29 is where it is needed, encircling the lower part of trapezoidal semiconductor finger 23 so that it can effectively pinch off the vertical conducting channel at its smallest dimension at the narrow base of the trapezoid. Typical dimensions are that grooves 21 have a depth of 10 μm, and that the minimum channel width between gates is about 5 to 10 μm. The total thickness of n⁻ epitaxial layer 16 is approximately 50 μm; the groove depth is seen to be substantially less than half of this total thickness so that the device has high voltage withstanding capability. Substrate layer 15 is typically 15 mils thick and is part of the drain region. In an exemplary device with the above dimensions the drain voltage, $V_D$, is approximately 600 volts and the gate voltage, $V_G$, is approximately 10 volts; this is an example of the high blocking gain (ratio of drain voltage to gate voltage) that is possible.

Figure 12:
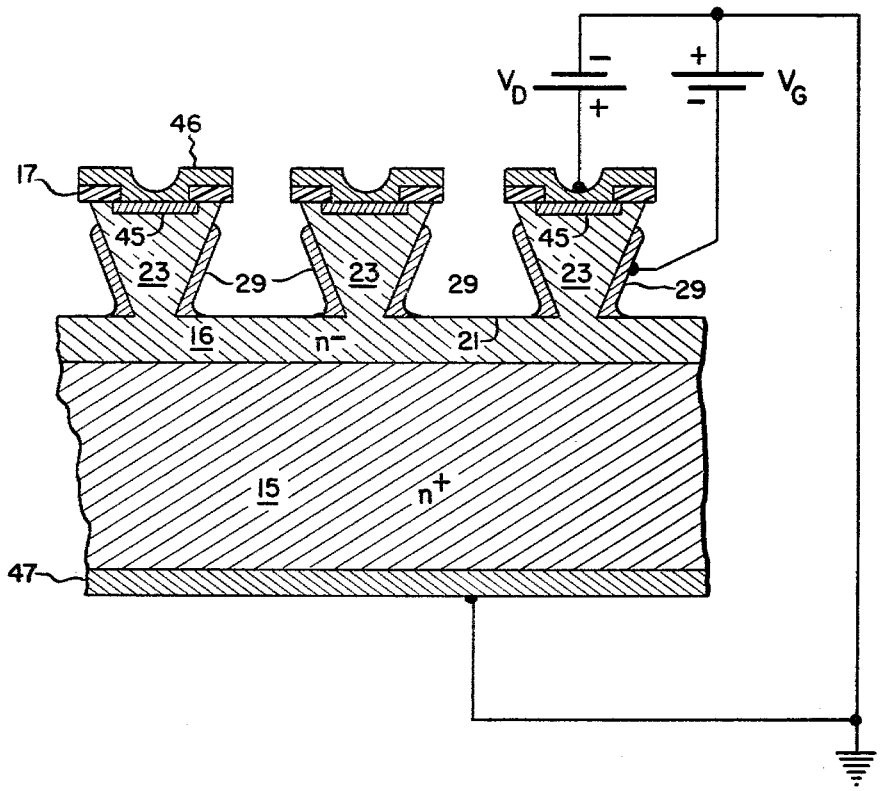
FIG. 12 is a modification of FIG. 11 for operation at ultra high frequencies.

The embodiment of FIG. 12 is an ultra high frequency device for operation above 1 GHz. This interdigitated vertical field effect transistor has the drain contact 46 at the top and the source metallization 47 at the bottom. The depth of grooves 21 is approximately 5 μm and the narrow base of trapezoidal finger 23 has a width of 1 μm or less. This corresponds to the minimum width of the vertical conducting channel. Lightly doped epitaxial layer 16 is relatively thin such that the depth of the grooves is substantially greater than one-half the total thickness of the epitaxial layer.

Figure 13:
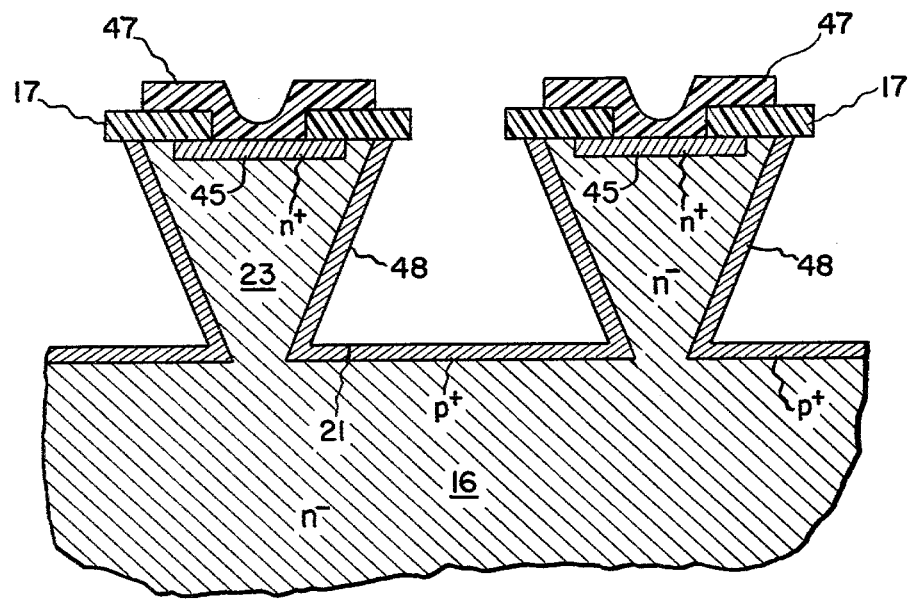
FIGS. 13 and 14 are partial cross sections illustrating fabrication of diffused p-n junction gates.
Figure 14:
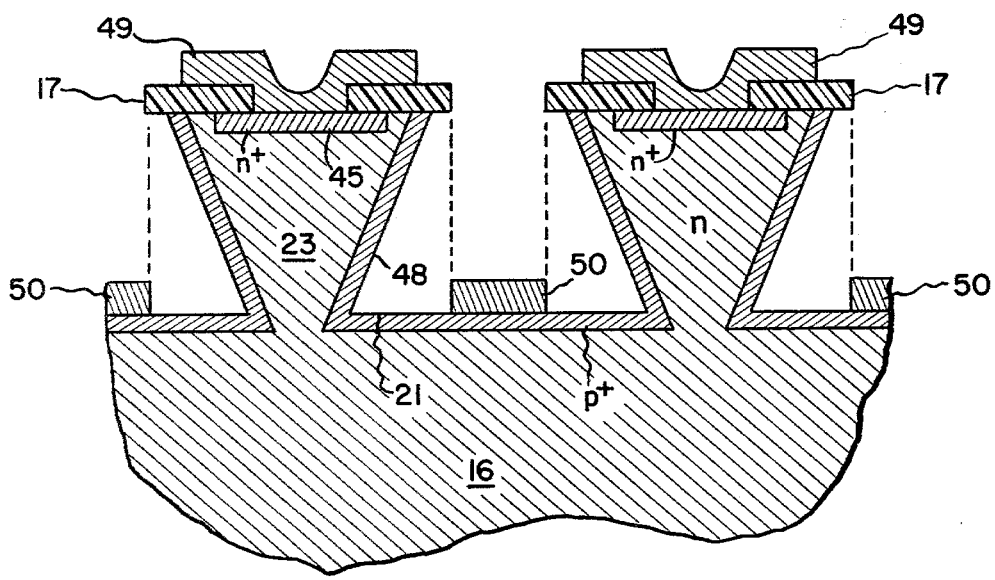

The gate region can be any of several types of barriers which create a depletion region in the channel when the gate is reverse biased. The Schottky barrier gate and p-n junction gate have been mentioned and another possibility, though less advantageous for this application, is the MOS (metal oxide semiconductor) gate. An alternative method of junction gate fabrication (epitaxial refill has been covered) is by diffusion from either the vapor phase or using a doped oxide source, but this will extend the gate to the top surface of the device as shown in FIGS. 13 and 14. A different process sequence is employed to arrive at the structure in FIG. 13 before diffusion of the p+ gate regions. A thick insulating layer 17 is deposited on the top surface of the wafer and windows are opened for diffusion of n+ souce or contact regions 45. A thin oxide or other insulating layer 47 seals the openings and both layers are patterned and openings made for preferential etching. Trapezoidal grooves 21 and the guard rings or transverse grooves are etched as previously described. The gate region junctions are diffused through the pattern of openings and result in continuous p+ regions 48 on the walls of trapezoidal fingers 23 and on the bottoms of grooves 21. Thin oxide layers 47 are chemically removed and vertical evaporation of metal produces source metallizations 49 on the top surfaces of the trapezoidal fingers and gate metallizations 50 on the diffused regions at the bottoms of the grooves. The overhang of insulating layer 17 shadows the evaporation. The metal is then alloyed to the GaAs to provide the contacts.

The junction grid can also be fabricated by directional ion implantation followed by directional metal contact evaporation. This process has the advantage of achieving a gate junction only at the bottom corners of grooves 21 where it is needed for good pinch-off capability while maintaining a minimum gate area to decrease the gate (input) capacitance. It is necessary, however, to align the ion implanted area and the metal in the grooves.

Other features and aspects of the vertical field effect transistor with current flow essentially normal to the surface, and a comparison of this device with planar field effect transistors in which current flow is parallel to the surface, are given in U.S. Pat. No. 4,129,879, the disclosure of which is incorporated herein by reference. P-channel devices are also possible.

While this invention has been particularly shown and described with reference to several preferred embodiments thereof, it will be understood by those skilled in the art that various changes in form and details may be made therein without departing from the spirit and scope of the invention.

The invention claimed is:

1. A high frequency field effect transistor comprising:
a heavily doped semiconductor layer and an overlying lightly doped semiconductor layer both of the same conductivity type and of the same III–V compound,
the surface of said lightly doped layer having a row of parallel trapezoidal grooves connected together at either end by transversely extending grooves which encircle a plurality of upstanding elongated semiconductor fingers which individually have an isosceles trapezoid cross section with a wide base at the surface and an interior narrow base, a channel region being at and adjacent to each narrow base which extends substantially from wall to wall of the trapezoidal finger,
a gate region within said grooves surrounding the walls of each upstanding trapezoidal finger, and contact means for making electrical connection to all of said gate regions,
first metallizations on the surfaces of said trapezoidal fingers and means for interconnecting said first metallizations, and a second metallization on the opposing surface of said heavily doped layer, one of said first and second metallizations being the source contact and the other the drain contact.

2. The field effect transistor of claim 1 wherein both semiconductor layers have a (001) plane crystallographic orientation and wherein said parallel trapezoidal grooves are perpendicular to the [110] crystal flat.

3. The field effect transistor of claim 2 wherein said gate regions are Schottky metal gates essentially on only the walls of said trapezoidal fingers.

4. The field effect transistor of claim 2 wherein said gate regions are opposite conductivity type epitaxial material which fills at least the bottoms of said grooves.

5. The field effect transistor of claim 2 wherein said gate regions are diffused opposite conductivity type regions on the walls of said upstanding fingers and on the bottoms of said trapezoidal grooves.

6. A high frequency field effect transistor comprising:
a heavily doped (001) plane semiconductor layer and an overlying lightly doped (001) plane semiconductor layer both of n-type conductivity and of the same III–V compound,
the top surface of lightly doped layer having a row of parallel trapezoidal grooves connected at either end by transversely extending grooves so as to encircle a plurality of elongated isosceles trapezoid semiconductor fingers which have a broad base at the top surface and an interior narrow base, a channel region being at and adjacent to each narrow base which extends from wall to wall of the trapezoidal finger,
an insulating layer on the top surface of each finger which projects laterally beyond its side edges,
a Schottky gate metal desposited essentially on only the walls of each trapezoidal finger completely surrounding every finger, and contact means for interconnecting the individual Schottky gates,
a heavily doped n-type region in the top surface of each trapezoidal finger aligned with an elongated central window in said insulating layer,
first metallizations on said heavily doped n-type regions and means for interconnecting said first metallizations, and a second metallization on the opposing surface of said heavily doped semiconductor layer, one of said first and second metallizations being the source contact and the other the drain contact.

7. The field effect transistor of claim 6 wherein the parallel trapezoidal grooves and semiconductor fingers are perpendicular to the [110] crystal flat and wherein the angle between the top surface and a nonparallel wall of the trapezoidal finger is 61° to 63°.

8. The field effect transistor of claim 7 wherein said first metallizations are the source contacts and wherein the depth of said grooves is substantially less than half the total thickness of said lightly doped semiconductor layer to provide voltage withstanding capability.

9. The field effect transistor of claim 7 wherein said first metallizations are the drain contacts and wherein the depth of said grooves is substantially greater than half the total thickness of said lightly doped semiconductor layer.

10. A high frequency field effect transistor comprising:
a heavily doped (001) plane semiconductor layer and an overlying lightly doped (001) plane semiconductor layer both of n-type conductivity and of the same III–V compound,
the top surface of said lightly doped layer having a row of parallel trapezoidal grooves connected at either end by transversely extending grooves so as to encircle a plurality of elongated isosceles trapezoid semiconductor fingers which have a broad base at the top surface and an interior narrow base, a channel region being at and adjacent to each narrow base which extends substantially from wall to wall of the trapezoidal finger,
an insulating layer on the top surface of each finger which projects laterally beyond its side edges,
p-n junction gate regions within said grooves on the bottom of said grooves and completely surrounding the walls of every trapezoidal finger, and contact means for interconnecting the individual gate regions,
a heavily doped n-type region in the top surface of each trapezoidal finger aligned with an elongated central window in said insulating layer,
first metallizations on said heavily doped n-type regions and means for interconnecting said first metallizations, and a second metallization on the opposing surface of said heavily doped semiconductor layer, one of said first and second metallizations being the source contact and the other the drain contact.

11. The field effect transistor of claim 10 wherein the parallel trapezoidal grooves and semiconductor fingers are perpendicular to the [110] crystal flat and wherein the angle between the top surface and a nonparallel wall of the trapezoidal finger is 61° and 63°.

12. The field effect transistor of claim 11 wherein said junction gate regions are epitaxial p-type semiconductor which substantially fills said grooves.

13. The field effect transistor of claim 11 wherein said junction gate regions are diffused p-type regions on the walls of said trapezoidal fingers and the bottoms of said grooves, and wherein said contact means are gate metallizations deposited on the diffused regions at the bottoms of said grooves.

14. A method of making a high frequency field effect transistor comprising the steps of:
providing a heavily doped (001) crystalline plane III–V compound semiconductor substrate having a lightly doped epitaxial layer,
applying an insulating layer to said epitaxial layer which has a pattern of openings including a row of windows oriented perpendicular to the [110] crystal flat,
preferentially etching said epitaxial layer through said openings to yield a row of trapezoidal grooves which are undercut beneath the edges of said insulating layer and are connected at either end by transversely extending grooves to thereby create a plurality of elongated isosceles trapezoid semiconductor fingers which each have a wide base at the top surface an interior narrow base,
forming gate regions within said etched grooves which completely surround at least the lower part of the walls of every trapezoidal finger and are capable when properly biased of pinching off a conducting channel at and adjacent to the narrow base which extends from wall to wall of every finger, and making contact to all of said gate regions,
opening an elongated window in said insulating layer to the top surface of each trapezoidal finger and fabricating a heavily doped contact region in every top surface,
depositing first metallizations on said heavily doped contact regions and interconnecting all said first metallizations, and depositing a second metallization on the opposing surface of said substrate, one of said first and second metallizations being the source contact and the other drain contact.

* * * * *